United States Patent
List, III et al.

(10) Patent No.: US 10,233,566 B2
(45) Date of Patent: Mar. 19, 2019

(54) CONTINUOUS SINGLE CRYSTAL GROWTH OF GRAPHENE

(71) Applicant: UT-Battelle, LLC, Oak Ridge, TN (US)

(72) Inventors: Frederick Alyious List, III, Andersonville, TN (US); Yijing Y. Stehle, Oak Ridge, TN (US); Ivan V. Vlassiouk, Oak Ridge, TN (US); Sergei N. Smirnov, Las Cruces, NM (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 15/393,464

(22) Filed: Dec. 29, 2016

(65) Prior Publication Data

US 2018/0187331 A1    Jul. 5, 2018

(51) Int. Cl.
| | |
|---|---|
| *C30B 25/02* | (2006.01) |
| *C30B 25/14* | (2006.01) |
| *C30B 29/02* | (2006.01) |
| *C23C 16/26* | (2006.01) |
| *C23C 16/54* | (2006.01) |
| *C23C 16/455* | (2006.01) |

(52) U.S. Cl.
CPC ............ *C30B 25/025* (2013.01); *C23C 16/26* (2013.01); *C23C 16/45563* (2013.01); *C23C 16/545* (2013.01); *C30B 25/14* (2013.01); *C30B 29/02* (2013.01)

(58) Field of Classification Search
CPC combination set(s) only.
See application file for complete search history.

(56) References Cited

U.S. PATENT DOCUMENTS

| 8,075,864 B2 | 12/2011 | Choi et al. |
| 8,470,400 B2 | 6/2013 | Colombo et al. |
| 8,476,739 B2 | 7/2013 | Okai et al. |

(Continued)

FOREIGN PATENT DOCUMENTS

| CN | 102020263 | 4/2011 |
| CN | 102102220 | 6/2011 |

(Continued)

OTHER PUBLICATIONS

Bhaviripudi et al. Role of Kinetics in Chemical Vapor Deposition Synthesis of Uniform Large Area Graphene Using Copper Catalyst. Nano Letter, 2010, 10, 4128-4133.

Vlassiouk et al. Role of Hydrogen in Chemical Vapor Deposition Growth of Large Single-Crystal Graphene. ACSNano, vol. 5, No. 7, 2011, 6069-6076, published online Jun. 27, 2011.

(Continued)

*Primary Examiner* — Erin F Bergner
(74) *Attorney, Agent, or Firm* — Warner Norcross + Judd LLP

(57) ABSTRACT

Systems and methods for synthesizing continuous single crystal graphene are provided. A catalytic substrate is drawn through a chemical vapor deposition chamber in a first lengthwise direction while flowing a hydrogen gas through the chemical vapor deposition chamber in the same lengthwise direction. A hydrocarbon precursor gas is supplied directly above a surface of the catalytic substrate. A high concentration gradient of the hydrocarbon precursor at the crystal growth front is generated to promote the growth of a continuous single crystal graphene film while suppressing the growth of seed domains ahead of the crystal growth front.

12 Claims, 10 Drawing Sheets

(56) References Cited

U.S. PATENT DOCUMENTS

| | | | |
|---|---|---|---|
| 2009/0220409 A1* | 9/2009 | Curliss | B01J 6/008 423/447.2 |
| 2010/0021708 A1 | 1/2010 | Kong et al. | |
| 2010/0098904 A1 | 4/2010 | Dai et al. | |
| 2011/0143045 A1 | 6/2011 | Veerasamy | |
| 2011/0195207 A1 | 8/2011 | Hong et al. | |
| 2011/0201201 A1 | 8/2011 | Arnold et al. | |
| 2011/0280794 A1 | 11/2011 | Holmes | |
| 2012/0251432 A1* | 10/2012 | Cooper | B01J 37/0215 423/447.3 |
| 2013/0071565 A1* | 3/2013 | Malecki | B82Y 40/00 427/249.1 |
| 2013/0089666 A1 | 4/2013 | Boi et al. | |
| 2013/0174968 A1 | 7/2013 | Vlassoiuk et al. | |
| 2014/0205763 A1 | 7/2014 | Lu et al. | |

FOREIGN PATENT DOCUMENTS

| | | |
|---|---|---|
| CN | 102127750 | 7/2011 |
| CN | 102134067 | 7/2011 |
| CN | 102191476 | 9/2011 |
| CN | 102212794 | 10/2011 |
| CN | 102220566 | 10/2011 |
| CN | 105329885 A | 2/2016 |

OTHER PUBLICATIONS

Thorsten Hesjedal. Continuous roll-to-roll growth of graphene films by chemical vaport deposition. Applied Physics Letters 98,2011.

Losurdo, Maria et al. Graphene CVD growth on copper and nickel: role of hydrogen in kinetics and structure. Phys. Chem. Chem. Phys., 2011, 13, 20836-20843.

International Search Report and Written Opinion for International Application No. PCT/US2013/23078, dated Mar. 19, 2013.

Cecco, Alfonso Reina, "Single- and Few-Layer Graphene by Ambient Pressure Chemical Vapor Deposition on Nickel," Massachusetts Institute of Technology, Jun. 2010.

Dong, Xiaochen, et al "Growth of large-sized graphene thin-films by liquid precursor-based chemical vapor deposition under atmospheric pressure," published in Elsevier, Web published May 7, 2011.

Han, Gang Hee et al, "Influence of Copper Morphology in Forming Nucleation Seeds for Graphene Growth," American Chemical Society Nano Letters, published on Aug. 24, 2011.

Wu, Tianru, et al "Fast growth of inch-sized single-crystalline graphene from a controlled single nucleus on Cu—Ni alloys," Nature Materials, published online Nov. 23, 2015.

International Search Report and Written Opinion for WO Application No. PCT/US2017/066301, dated Mar. 7, 2018.

\* cited by examiner

Table 1. *Effect of the conditions on graphene crystal growth*

| Sample Name | Main tube flow, L/min | Foil thickness | Nozzle H2/Ar, sccm | Nozzle CH4/Ar, sccm | Pulling rate, cm/h | Results |
|---|---|---|---|---|---|---|
| Pure Cu. T=1050°C ||||||||
| RR254 | 4 | 5 mil | 8 | 0.8 | 2.2 | Too fast. Severe nucleation ahead. |
| 10% Ni/Cu. T=1100°C ||||||||
| RR234 | 4 | 1 mil | 8 | 0.8 | 2.2 | No nucleation ahead. Intermittently aligned hexagons. |
| RR401 | 4 | 3mil | 8 | 0.8 | 2.2 | Some nucleation ahead.Intermittently aligned hexagons |
| RR402 | 4 | 3mil | 8 | 0.8 | 0.4 | Aligned hexagons/slippage |
| RR403 | 4 | 3mil | 8 | 0.8 | 0.4 | Aligned hexagons/slippage |
| RR405 | 4 | 3mil | 8 | 0.8 | 1.8 | Well aligned hexagons |
| RR406 | 4 | 3mil | 8 | 0.8 | 1.8 | Well aligned hexagons |
| RR407 | 1 | 3mil | 8 | 0.8 | 1.8 | Some nucleation aheadRotating hexagons |
|  | 4 | 3 mil | 0 | 3 | 2.5 | Some nucleation aheadRotating hexagons |
| RR520 | 4 | 3 mil | 0 | 9 | 2.2 | Some nucleation ahead.Rotating hexagons. |
|  | 4 | 3 mil | 4.5 | 4.5 | 2.2 | Significant nucleation ahead. Rotating hexagons. |
| RR522 | 16 | 3 mil | 4.5 | 4.5 | 2.2 | Some nucleation ahead.Rotating hexagons. |
| RR523 | 7 | 3 mil | 7 | 2 | 1.8 | No nucleation aheadRotating hexagons |
| RR524 | 4 | 3 mil | 8 | 0.5 | 1.8 | No nucleation ahead.Small hexagon rotation. |
|  | 4 | 3 mil | 8 | 0.8 | 1.2 | No nucleation ahead Well aligned hexagons |
| RR526 | 4 | 3 mil | 16 | 1.5 | 1.8 | Some nucleation ahead.Rotating hexagons |
| RR527 | 4 | 3 mil | 4 | 0.5 | 1.8 | No nucleation ahead Intermittently aligned hexagons. |
| RR528 | 4 | 1 mil | 8 | 0.8 | 1.8 | No nucleation ahead Well aligned hexagons. |
| RR529 | 4 | 1 mil | 8 | 0.8 | 2.2 | No nucleation ahead.Intermittently aligned hexagons. |
| RR602 | 4 | 3 mil | 8 | 1 | 1.8 | No nucleation ahead. |
| RR604 | 4 | 1 mil | 8 | 1 | 1 | No nucleation ahead,LEED patterns were obtained. |
| RR607 | 4 | 3 mil | 8 | 1 | 1 | No nucleation ahead, 1 foot long. |
| 15% Ni/Cu. T=1100°C ||||||||
| RR318 | 4 | 3 mil | 8 | 0.8 | 2 | No nucleation ahead. |
| RR323 | 4 | 3mil | 8 | 0.8 | 2 | No nucleation ahead. |
| RR332 | 4 | 1 mil | 8 | 0.8 | 2.5 | No nucleation ahead. |

FIG. 9

CONTINUOUS SINGLE CRYSTAL GROWTH OF GRAPHENE

This invention was made with government support under Contract No. DE-AC05-00OR22725 awarded by the U.S. Department of Energy. The government has certain rights in the invention.

BACKGROUND

The present invention relates to graphene synthesis via chemical vapor deposition (CVD) and, more particularly, to systems and methods for continuous single crystal growth of graphene.

Graphene is a single layer of carbon having a hexagonal bonding structure in a one-atom thick sheet. Graphene has a great potential in a wide range of applications from photovoltaics and electronics to desalination membranes. It has been demonstrated that graphene can be grown via CVD in multiple layers or as a single monocrystalline layer with the size of single crystals up to 1 cm. While 2-dimensional, single crystal materials, such as graphene, exhibit the potential for use in many applications, their performance is strongly affected by the quality of the material, with the single crystal form considered as the highest quality. Typically, 2-dimensional, single crystal materials are produced using epitaxial growth processes; however, this process requires single crystal substrates for deposition, which can be cost prohibitive. Moreover, epitaxial growth of graphene can be accompanied by difficult to control line defects due to more than one epitaxial adsorption geometry. Thus, despite the well-recognized potential of graphene single crystal layers, a reliable technology for the scaled up production of single crystal graphene remains a bottleneck in the transition from graphene research to the development of practically viable graphene devices that utilize single crystal graphene.

The performance of 2-dimensional, single crystal materials is greatly affected by the quality of the material and the best performance is typically observed when the material is defect free. That is why, despite recent advance in chemical vapor deposition (CVD) techniques, the standard quality comparison for 2-dimensional, single crystal materials still relies on microexfoliation methods that yield small amounts of high quality single crystal materials. The grain boundaries between single domains of graphene produced using typical CVD methods can compromise mechanical properties, chemical stability, electronic properties, and thermal conductivity of the material.

Thus, there remains a need for systems and methods for the scalable and cost-effective manufacture of single crystal graphene. In particular, there remains a need for a method of forming large single graphene crystals, particularly continuous single crystal graphene using inexpensive polycrystalline substrates.

SUMMARY

Systems and methods for synthesizing continuous single crystal graphene are provided. The systems and methods generally include drawing a catalytic substrate through a chemical vapor deposition chamber in a lengthwise direction while flowing a gas mixture with hydrogen gas through the chemical vapor deposition chamber in a lengthwise direction. The gas mixture provides the hydrogen necessary for catalytic with the substrate and also etches away undesired graphene seeds that may form upstream, by what can be considered as forming a "background wind" during growth of the single crystal graphene. A hydrocarbon containing precursor gas mixture is supplied in a designated region directly above a surface of the catalytic substrate. The movement of the catalytic substrate, the hydrogen containing background wind, and the supply of hydrocarbon precursor locally and directly above the catalytic substrate combine to generate a high concentration gradient of the hydrocarbon precursor at the crystal growth front that promotes the growth of a continuous single crystal graphene film.

According to one embodiment, a method of synthesizing graphene includes heating the interior of a chemical vapor deposition chamber to a temperature of above 800° C. and drawing a catalytic substrate through the interior of the chemical vapor deposition chamber in a lengthwise direction. A hydrogen gas is flowing through the chemical vapor deposition chamber in the lengthwise direction. The hydrogen can be mixed with an inert gas to form a buffer gas. A hydrocarbon gas is introduced through an opening within the chemical vapor deposition chamber in a region above the catalytic substrate. The hydrocarbon gas and the hydrogen gas form a precursor gas mixture that reacts with the catalytic substrate to form a continuous single crystal graphene on the catalytic substrate while the catalytic substrate is being drawn in the direction of the flow of the hydrogen gas mixture.

In another embodiment, a system for producing a single crystal graphene monolayer includes a source of hydrocarbon gas and a source of hydrogen gas. A deposition tube defines a deposition chamber having an inlet through which a catalytic substrate enters the deposition chamber and an outlet through which the catalytic substrate exits the deposition chamber. A gas inlet is provided for introducing the hydrogen gas mixture into the deposition chamber flowing in a lengthwise direction at a predetermined flow rate. A motor is adapted to move the catalytic substrate through the deposition chamber in the same lengthwise direction at a predetermined drawing rate. An opening is disposed within the deposition chamber and fluidly coupled with the source of hydrocarbon gas mixture. The opening is disposed directly above the catalytic substrate and is adapted to locally introduce the hydrocarbon to a surface of the catalytic substrate at a predetermined flux rate. The system further includes a heat source adapted to heat the deposition chamber to a temperature of at least 800° C. The hydrocarbon gas can react with the catalytic substrate in the presence of the hydrogen gas to form a single crystal graphene monolayer on the catalytic substrate as the catalytic substrate moves past the opening.

The present invention can therefore provide improved systems and methods for the scalable, cost-effective production of single crystal graphene. The improved systems and methods can achieve graphene that is sufficiently strong to withstand transfer to other substrates without the use of polymer supporting layers, which can eliminate polymer residue ubiquitous in the handling of two dimensional materials. The present invention can also facilitate the production of continuous single crystal graphene for a wide variety of applications, including large area displays and photovoltaic cells, while also decreasing manufacturing costs and production time.

These and other features and advantages of the present invention will become apparent from the following descrip-

BRIEF DESCRIPTION OF THE DRAWINGS

FIG. 9 includes a table identifying the conditions evaluated for growth of graphene on a substrate.

DETAILED DESCRIPTION

I. Overview

The embodiments of the invention as contemplated and disclosed herein include systems and methods for single crystal graphene production on a substrate by a locally controlled chemical vapor deposition (CVD). As set forth below, to grow continuous, 2-dimensional single crystal graphene on non-epitaxial substrates (i.e. polycrystalline substrates), a single crystal domain is enlarged during growth while the formation of undesired new seed growth ahead of the main crystal growth front is suppressed. The single domain growth can be enlarged by forming a high concentration gradient of a hydrocarbon precursor at the crystal growth front.

The high concentration gradient of the hydrocarbon precursor at the crystal growth front can be achieved by supplying a hydrocarbon gas mixture to the substrate surface at a predetermined location above the substrate surface. A hydrogen gas mixture is supplied to the deposition chamber at a high flow rate and in a predetermined flow direction to interact with the hydrocarbon gas to facilitate forming the high concentration gradient of the hydrocarbon precursor at the crystal growth front. The formation of the high concentration gradient of the hydrocarbon precursor is further facilitated by drawing the substrate through the deposition chamber at a predetermined speed in the same direction as the flow direction of the hydrogen gas mixture. Thus, the hydrogen gas is flowing through the chemical vapor deposition chamber in a lengthwise direction and the substrate is traveling through the chemical vapor deposition chamber in the same lengthwise direction during growth of the single crystal graphene. The interaction of the high speed, directional hydrogen gas mixture with the localized hydrocarbon gas and the movement of the substrate in the same direction as the flow of the hydrogen gas produce a high concentration gradient of the hydrocarbon precursor at the main crystal growth front that promotes the enlargement of a single domain over the nucleation of new seed domains.

II. Graphene Synthesis

Figure 1:
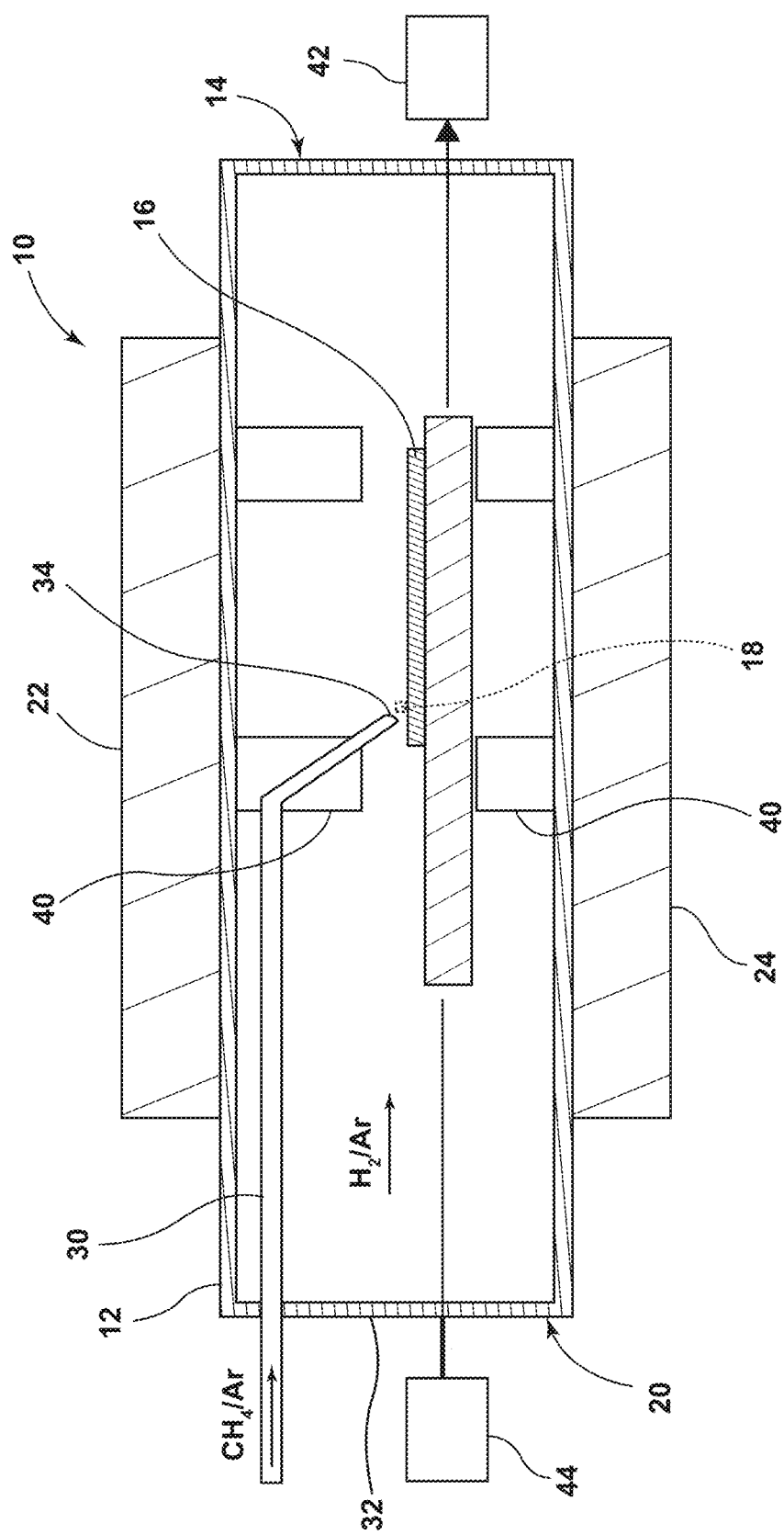
FIG. 1 is a schematic diagram of a chemical vapor deposition chamber for the controlled synthesis of single crystal graphene.

Referring now to FIG. 1, a schematic diagram of a chemical vapor deposition chamber in accordance with one embodiment of the present invention is illustrated and generally designated 10. The chemical vapor deposition chamber 10 includes a primary housing 12 having an inlet 14 for the continuous in-flow of a catalytic substrate 16, an internal deposition region 18, and an outlet 20 for the continuous exit of the catalytic substrate 16 and newly formed graphene layer. A length of the chemical vapor deposition chamber 10 is defined by the distance between the inlet 14 and the outlet 20. External heating elements 22, 24 (e.g., resistive, electromagnetic and/or inductive) heat the catalytic substrate 16 to a preselected temperature within the housing 12.

The heat source can include resistive elements 22, 24 spaced apart from each other across the width of the chemical deposition chamber 10 as shown in FIG. 1. In other embodiments, one or more infrared or plasma arc lamps are positioned above or on opposing sides of the chemical vapor deposition chamber 10. Inductive heating may be used instead of an infrared or a plasma arc lamp.

The chemical vapor deposition chamber 10 also includes a reactant supply member 30 which delivers a reactant gas that includes a hydrocarbon precursor to the surface of the catalytic substrate 16 and a hydrogen gas inlet 32. The reactant supply member 30 can be in the form of a conduit or a chamber connected at one end with one or more sources of a reactant gas. The reactant supply member 30 includes one or more openings 34 at the other end for delivering the hydrocarbon precursor to the deposition region 18. The opening 34 is disposed above the surface of the catalytic substrate 16 in the deposition region 18. The reactant gas can selectively flow through the reactant supply member 30 to the opening 34 for delivery to the surface of the catalytic substrate 16.

In the configuration illustrated in FIG. 1, the reactant supply member 30 is in the form of a conduit having a nozzle opening disposed above the surface of the catalytic substrate 16 in the deposition region 18. The nozzle includes a projecting part having at least one opening (of any geometry) and is in fluid communication with the reactant gas. Alternatively, the reactant supply member 30 can be in the form of a conduit having multiple openings, e.g. slits, disposed above the surface of the catalytic substrate 16 in the deposition region 18. The configuration of the reactant supply member 30 can vary as desired based on the dimensions of the catalytic substrate 16 and desired characteristics of the single crystal graphene layer.

The hydrogen gas inlet 32 can have any suitable form and is optionally configured to facilitate a directional flow of the hydrogen gas mixture through the deposition chamber 10. The hydrogen gas inlet 32 can be configured to promote the hydrogen gas mixture to flow in a desired direction within the deposition chamber and optionally to promote a uniform flow field across the cross-sectional area of the deposition chamber 10. For example, the hydrogen gas inlet 32 may include a grate having thin vanes orient the flow of hydrogen gas mixture and to facilitate a uniform flow field across the cross-sectional area of the deposition chamber 10. The hydrogen gas inlet 32 may be formed directly in the deposition chamber 10 and/or may include one or more structures provided within the deposition chamber 10 to promote a uniform flow field across the cross-sectional area of the deposition chamber 10.

As noted above, the chemical vapor deposition chamber 10 includes a deposition region 18 for the controlled formation of single crystal graphene on the catalytic substrate 16. The location of the deposition region 18 relative to the catalytic substrate 16 is based on the position of the hydrocarbon precursor supply opening 34 relative to the catalytic substrate 16. The area over which the reactant gas reacts with the catalytic substrate 16 depends on a variety of factors, non-limiting examples of which include the temperature of the catalytic substrate 16, gas flow rates of the reactant gas and the hydrogen gas mixture, and a concentration of the components of the reactant gas and hydrogen gas mixture.

Within the deposition region 18, a precursor gas mixture interacts with the surface of the catalytic substrate 16 to form a single crystal graphene layer on the surface. The precursor gas mixture can be considered as including two parts. The first part includes the reactant gas delivered through the hydrocarbon precursor supply opening 34 to the surface of the catalytic substrate 16. The reactant gas can include a mixture of a hydrocarbon precursor and an inert gas. Non-limiting examples of a hydrocarbon precursor gas suitable for forming graphene single crystals include methane, ethane, propane, butane, pentane, hexane, heptane, octane, benzene, toluene, and combinations thereof. The inert gas can include argon or other noble gases, such as helium. The reactant gas can optionally include hydrogen. The second part of the precursor gas mixture includes the hydrogen gas that is supplied to the chemical vapor deposition chamber 10 in a predetermined flow direction at a predetermined flow rate. The hydrogen gas can include a mixture of hydrogen and an inert gas, non-limiting examples of which include argon and helium. For example, the hydrogen gas can be provided as a mixture of 1.5 to 3% of hydrogen, preferably 2.5% of hydrogen, in a noble gas.

The catalytic substrate 16 can be any substrate suitable for promoting the growth of graphene single crystals in the presence of the hydrocarbon precursor supplied by the reactant gas. In one example, the catalytic substrate 16 is a copper substrate which may be single crystal or polycrystalline. One of the advantages of the methods and systems described herein is the ability to grow graphene single crystals on a polycrystalline substrate, which is typically more cost effective to use than single crystal substrates. Optionally, the catalytic substrate 16 may be in the form of a nickel-copper alloy (Ni—Cu alloy). The Ni—Cu alloy may include 10-20% Ni, preferably 10-15% Ni, more preferably 10% Ni.

The catalytic substrate 16 can optionally be provided in a roll-to-roll configuration in which the catalytic substrate 16 is unwound from a first reel and moved through the deposition chamber 10 during graphene synthesis. The catalytic substrate 16 supporting the graphene single crystal layer can then be wound onto a second reel for storage or for subsequent delamination of the graphene single crystal layer onto a supporting substrate.

The chemical vapor deposition chamber 10 optionally includes baffles 40 that define a secondary chamber within the chemical vapor deposition chamber 10. The baffles 40 can be provided to decrease the cross-sectional area through which the hydrogen gas flows over the deposition area 18. Decreasing the cross-sectional area through which the gas flows increases the velocity of the hydrogen gas in the deposition area 18. Optionally, the baffles 40 may facilitate directing the hydrogen gas to flow in a uniform flow field over at least the deposition area 18. As is discussed in further detail below, increasing the velocity of the hydrogen gas in the deposition area 18 facilitates growth of a single main crystal and inhibits the formation of undesired crystal domains ahead of the growth front. Alternatively, rather than providing a secondary chamber within the main chemical vapor deposition chamber 10, the dimensions of the main chamber 10 may be configured to provide the desired velocity of the hydrogen gas in the deposition area 18.

One or more motors 42, 44 can be provided to draw and/or push the catalytic substrate 16 through the chemical vapor deposition chamber 10 at a predetermined rate. In one example, the catalytic substrate 16 is drawn through the chamber 10 by a stepper motor 42 and optionally pushed through the chamber 10 by a motor 44. Alternatively, only one of the stepper motor 42 or the torque motor 44 is used to move the catalytic substrate 16 through the chamber 10.

Synthesizing single crystal graphene using the chemical vapor deposition chamber 10 generally includes (a) moving the catalytic substrate 16 through the deposition chamber 10 at a predetermined rate, (b) supplying a hydrogen gas mixture to the deposition chamber 10 at a predetermined flow rate and in the same direction as the direction in which the catalytic substrate 16 is traveling through the deposition chamber 10, and (c) locally supplying a hydrocarbon precursor at a predetermined location above the catalytic substrate 16. Elements (a), (b), and (c) combine to generate a high concentration gradient of the hydrocarbon precursor at the crystal growth front on the surface of the catalytic substrate 16 which promotes growth of a single crystal domain while inhibiting the growth of undesirable seed domains ahead of the growth front.

Local control of the concentration of the hydrocarbon precursor at the crystal growth is dependent upon the spreading of the precursor gas influx at the surface of the catalytic substrate 16. This spreading of the precursor gas can be altered by flowing the hydrogen gas mixture through the chemical vapor deposition chamber 10 at a flow rate and in a lengthwise direction that is the same as the direction in which the catalytic substrate 16 is traveling through the chamber 10. The high speed, directional flow of the hydrogen gas also reduces the formation of undesired seed formation ahead of the crystal growth front.

The rate at which the catalytic substrate 16 travels through the chemical vapor deposition chamber 10 is based on several factors, non-limiting examples of which include the flow rate of the hydrogen gas, the dimensions of the hydrocarbon precursor supply opening 34, a concentration of the hydrocarbon precursor, the flux through the hydrocarbon precursor supply opening 34, the deposition temperature, the dimensions of the catalytic substrate 16, the content of the catalytic substrate, and the desired dimensions of the continuous single graphene layer. If the rate of travel of the catalytic substrate is too quick, the continuity of the single crystal domain may be interrupted. In an exemplary embodiment, the catalytic substrate 16 is traveling through the chemical vapor deposition chamber 10 at a rate of from 0.4 cm/h to 2.5 cm/h, optionally from 1 cm/h to 2.5 cm/h, further optionally from 1.2 cm/h to 1.8 cm/h.

The flow rate of the hydrogen gas through the chemical vapor deposition chamber 10 is selected to counter the spreading of the hydrocarbon precursor influx on the surface of the catalytic substrate 16 to form a high concentration gradient of the hydrocarbon precursor at the crystal growth front. The flow rate is also selected to reduce the formation of undesired seeds ahead of the crystal growth front to promote the formation of a continuous single crystal graphene. For example, a hydrogen gas flow rate of 15 or 32 cm/s or greater has been found to promote continuous single crystal graphene growth while also suppressing seed growth. As described in more detail below, combining the high flow rate of the hydrogen gas with additional conditions, such as the rate at which the catalytic substrate 16 is traveling in the same direction to the hydrogen gas during crystal growth, deposition temperature, substrate content, and/or precursor concentration, for example, can further suppress seed growth and promote continuous single crystal graphene growth.

Local control of the hydrocarbon precursor concentration may also affect the concentration gradient of the hydrocarbon precursor at the crystal growth front. The dimensions of the precursor supply opening 34, the distance the opening 34 is above the surface of the catalytic substrate 16, and the flux through the opening 34 may all effect the ability to maintain a high concentration gradient at the crystal growth front. There is some spreading of the hydrocarbon precursor gas as it leaves the supply opening 34 and comes into contact with the surface of the catalytic substrate. A flux of 30 sccm or less, in some cases 10 sccm or less, through the opening 34 is generally sufficient to balance the need to maintain the high concentration gradient at the crystal growth front for supporting the growth of a continuous single crystal with the need to limit the graphene foot print and prevent undesirable spreading and seed formation ahead of the crystal growth front. The opening 34 is preferably disposed immediately above the surface of the catalytic substrate within 1 to 10 mm, preferably within 1 to 5 mm, optionally 3 mm. The diameter of the opening 34 may vary and may be selected based on the distance the opening 34 is located above the catalytic substrate surface to provide the desired degree of spreading of the hydrocarbon gas on the surface. For example, the opening 34 may be positioned approximately 1 to 10 mm above the surface, preferably 1 mm above the surface.

In addition, deposition temperature also plays a role in promoting the growth of a single crystal domain. High deposition temperatures, such as temperatures greater than 800° C., optionally greater than 1000° C., facilitates promoting the growth of a single crystal domain, whereas low temperatures tend to favor epitaxial growth. As discussed in more detail below, there is some spreading of the hydrocarbon gas influx from the hydrocarbon precursor supply opening 34 over the surface of the catalytic substrate 16. Utilizing high deposition temperatures, when the mobility of adatoms on certain substrates, such as a copper substrate, is high, facilitates the more effective attachment of carbon to the edges of the main graphene crystal domain, independent of the orientation of the substrate. This also inhibits formation of undesired seed domains ahead of the graphene growth front.

Thus, at a given flow rate of the hydrogen gas that already suppresses seed growth ahead of the crystal growth front, increasing the temperature can further suppress seed growth. The nature of the catalytic substrate can also be selected to further suppress seed growth. For example, utilizing a nickel-copper (Ni—Cu) alloy substrate rather than a copper substrate can further suppress seed growth. In an exemplary embodiment, the catalytic substrate is a copper substrate or a Ni—Cu alloy substrate having a Ni content of approximately 10%, to 20%, preferably approximately 10% to 15%.

Figure 3:
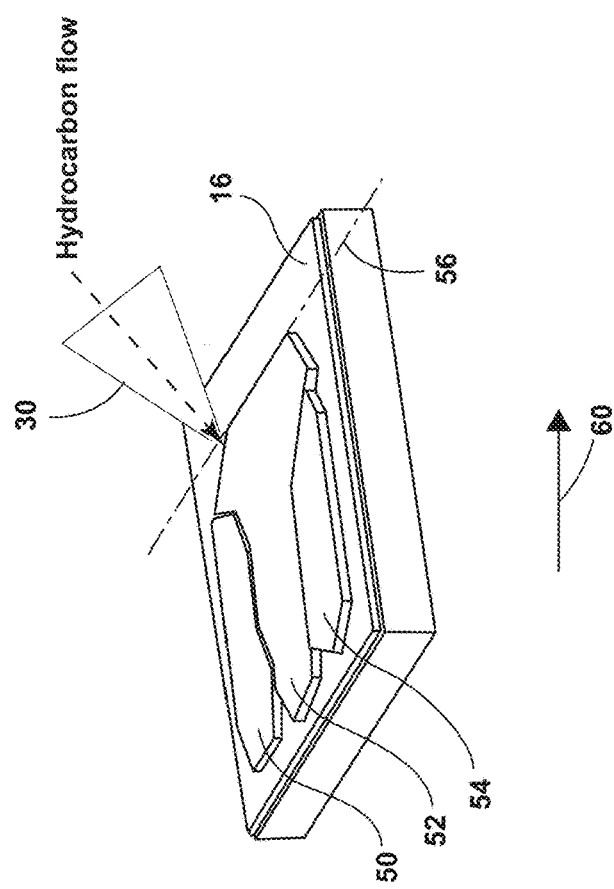
FIG. 3 is a schematic illustration of single crystal graphene growth on a moving substrate.
Figure 2:
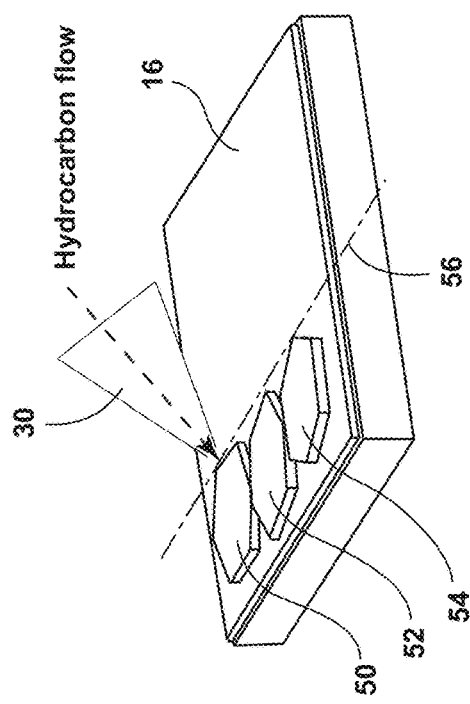
FIG. 2 is a schematic illustration of graphene domain growth on a stationary substrate.

Referring now to FIGS. 2 and 3, a schematic representation of the growth of single crystal graphene on a catalytic substrate 16 under different conditions is shown for the purposes of illustration. FIG. 2 illustrates the growth of three single crystal graphene domains 50, 52, 54 on the catalytic substrate 16 under more typical conditions in which the catalytic substrate 16 is stationary and a high concentration gradient of the hydrocarbon precursor at a crystal growth front 56 is not maintained. Under the conditions illustrated in FIG. 2, the resulting product will be polycrystalline in nature, as no single domain is being promoted over another. In addition, the conditions illustrated by FIG. 2 do not suppress seed growth ahead of the growth front 56, increasing the polycrystalline nature of the resulting graphene layer.

Figure 10:
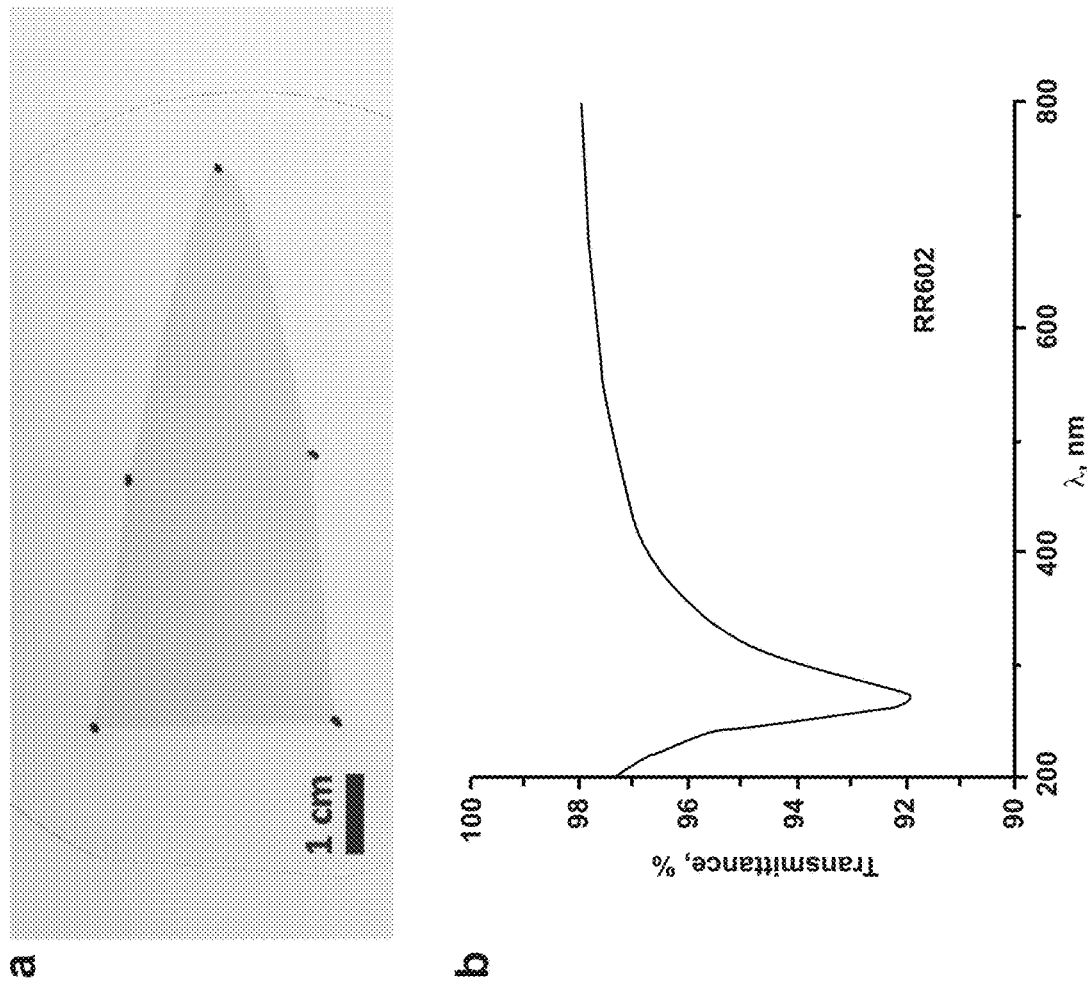
FIG. 10 includes a photograph of a single crystal graphene film and a corresponding UV/Vis transmittance can of the film.

In contrast, FIG. 3 is representative of crystal growth under conditions according to the embodiments of the invention in which a high concentration gradient of the hydrocarbon precursor at a crystal growth front 56 is maintained and the catalytic substrate 16 is moving in the same direction to the directional flow of the hydrogen gas, as illustrated by arrow 60. As illustrated in FIG. 3, growth conditions which maintain a high concentration gradient of the hydrocarbon precursor during movement of the catalytic substrate 16 at a predetermined rate promote growth of a single crystal domain 52 over the other domains 50, 54. In addition, the conditions of FIG. 3 inhibit seed growth ahead of the growth front 56, further facilitating the growth of large, singe crystal graphene products. The conditions represented by FIG. 3 can be used to generate single crystal graphene products several inches long, as illustrated in FIG. 10.

As set forth in Part III below, single crystal graphene growth according to the above method was shown to be dependent on a combination of several factors including (a) moving the catalytic substrate 16 through the deposition chamber 10 at a predetermined rate, (b) supplying a hydrogen gas mixture to the deposition chamber 10 at a predetermined flow rate and in the same direction as the direction in which the catalytic substrate 16 is moving through the deposition chamber 10, and (c) locally supplying a hydrocarbon precursor at a predetermined location above the catalytic substrate 16. Deposition temperature was also found to influence the growth of single crystal graphene.

III. Experimental Data

Single crystal graphene was synthesized according to embodiments of the present invention to illustrate single crystal domain growth and purity based on (a) moving the catalytic substrate 16 through the deposition chamber 10 at a predetermined rate, (b) supplying a hydrogen gas mixture to the deposition chamber 10 at a predetermined flow rate and in the same direction to the direction in which the catalytic substrate 16 is moving through the deposition chamber 10, and (c) locally supplying a hydrocarbon precursor at a predetermined location above the catalytic substrate 16, described below with reference to FIGS. 4-8.

Substrate Preparation

Copper foil catalytic substrates with thickness of either 25 or 75 microns were cleaned with acetone and isopropyl alcohol and subsequently electropolished in a phosphoric acid based solution to reduce the substrate roughness and remove surface contaminants, as is typically done in the field. After cleaning and polishing, the substrates were annealed at 1050° C. in 2.5% $H_2$/Ar atmosphere for 1 hour. Nickel was then electrodeposited on both sides of the polished copper substrates using regular nickel plating solution to form a nickel-copper (Ni—Cu) alloy substrate. Ni—Cu alloy substrates having 10%, 15%, and 20% Ni content were evaluated. The Ni—Cu alloy substrates were prepared for graphene synthesis by annealing the substrate for 2 hours at 1050° C. followed by annealing for 1.5 hours at 100° C. in 2.5% $H_2$/Ar atmosphere at atmospheric pressure.

Graphene Growth

Graphene growth was performed in a system having the components illustrated in FIG. 1. In particular, the chemical vapor deposition chamber 10 was in the form of a single zone 80 mm MTI split tube furnace. The reactant supply member 30 was in the form of an 80 mm quartz tube having a small diameter nozzle positioned within the center of the main deposition chamber for delivering the precursor gas mixture to the substrate. The precursor gas nozzle was located within a smaller, secondary deposition chamber located within the main deposition chamber. Chemical vapor deposition for all samples was performed at atmospheric pressure. Two stock gas mixtures were used: 2.5% $H_2$/Ar and 5% $CH_4$/Ar. Each stock gas was supplied separately to the chemical vapor deposition chamber. The $H_2$/Ar gas was supplied to the main deposition chamber at a predetermined flow rate and flow direction as the hydrogen gas. Mixtures of $CH_4$ and $H_2$ in different proportions in Ar were supplied to the catalytic substrate locally via the nozzle as the precursor gas mixture. In the examples provided herein, the nozzle diameter was 1 mm and was positioned approximately 3 mm above the catalytic substrate.

The velocity of the $H_2$/Ar gas above the catalytic substrate was increased by forcing the hydrogen gas to travel through a smaller opening between the main deposition chamber and the secondary chamber prior to passing the precursor gas nozzle. The velocity of the $H_2$/Ar gas is calculated as the flux divided by the area of the opening into the secondary chamber. The catalytic substrate was placed on top of a moveable quartz plate that was pulled by a tungsten wire through the deposition chamber via a high precision stepper motor and a controlled torque motor.

Cu—Ni alloy catalytic substrates were heated to 1100° C. for 45 prior to the start of graphene deposition while the Cu catalytic substrate was heated to 1050° C. After reaching the deposition temperature, the catalytic substrates were annealed in an $H_2$/Ar mixture for 30 minutes prior to positioning the substrate at a desired location below the precursor gas nozzle. Unless otherwise specified, the conditions for graphene growth include 4000 standard cubic centimeters per minute (sccm) of $H_2$/Ar gas through the main deposition chamber and 8 sccm $H_2$/Ar gas through the precursor gas nozzle. The desired flow of $CH_4$/Ar was supplied through the precursor gas nozzle. After graphene growth, the sample was either etched to form hexagonal holes for analysis or the deposition chamber was opened to allow the sample to cool.

Figure 4:
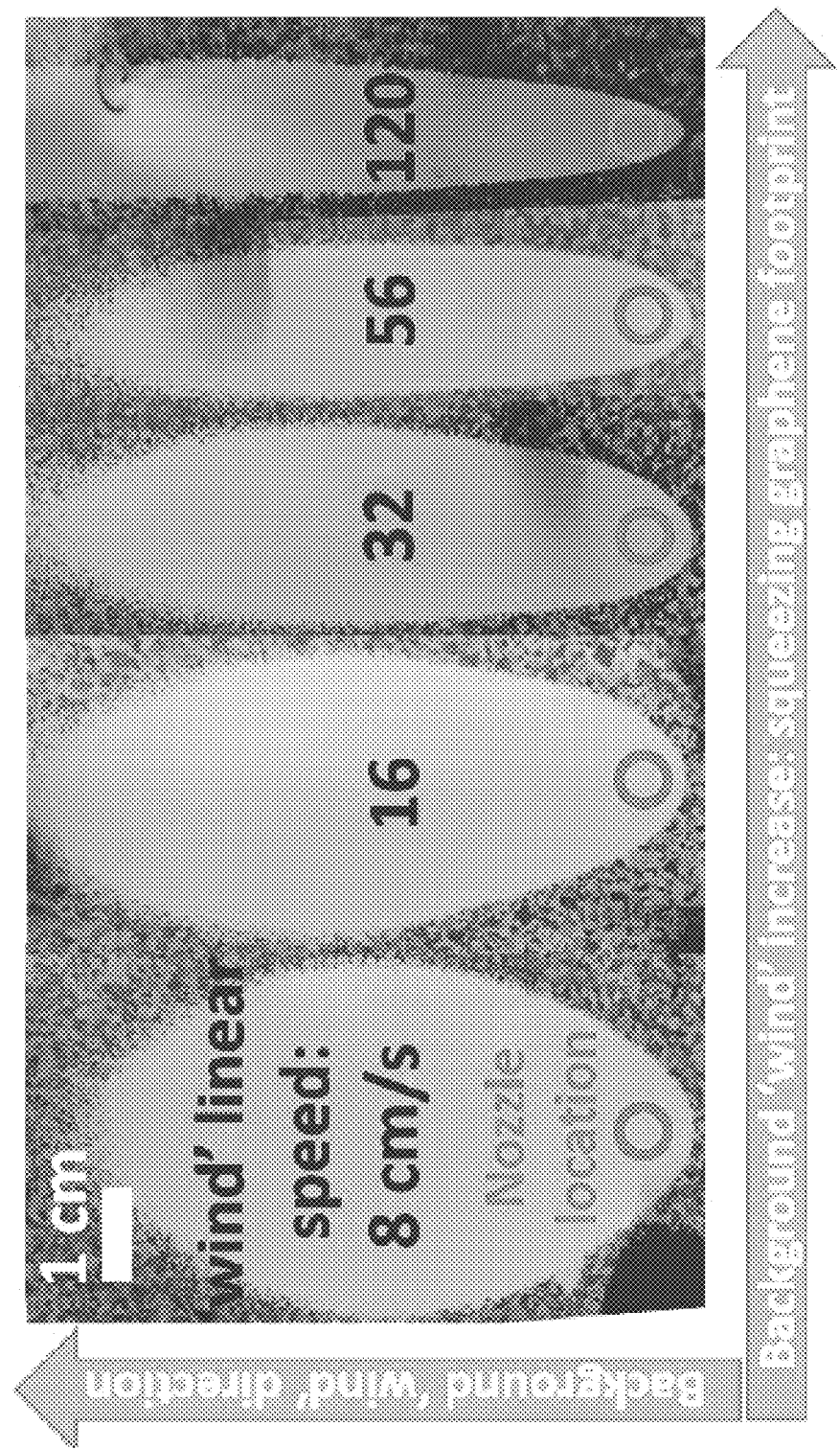
FIG. 4 includes images of a graphene footprint on a substrate at different hydrogen gas flow rates.
Figure 5:
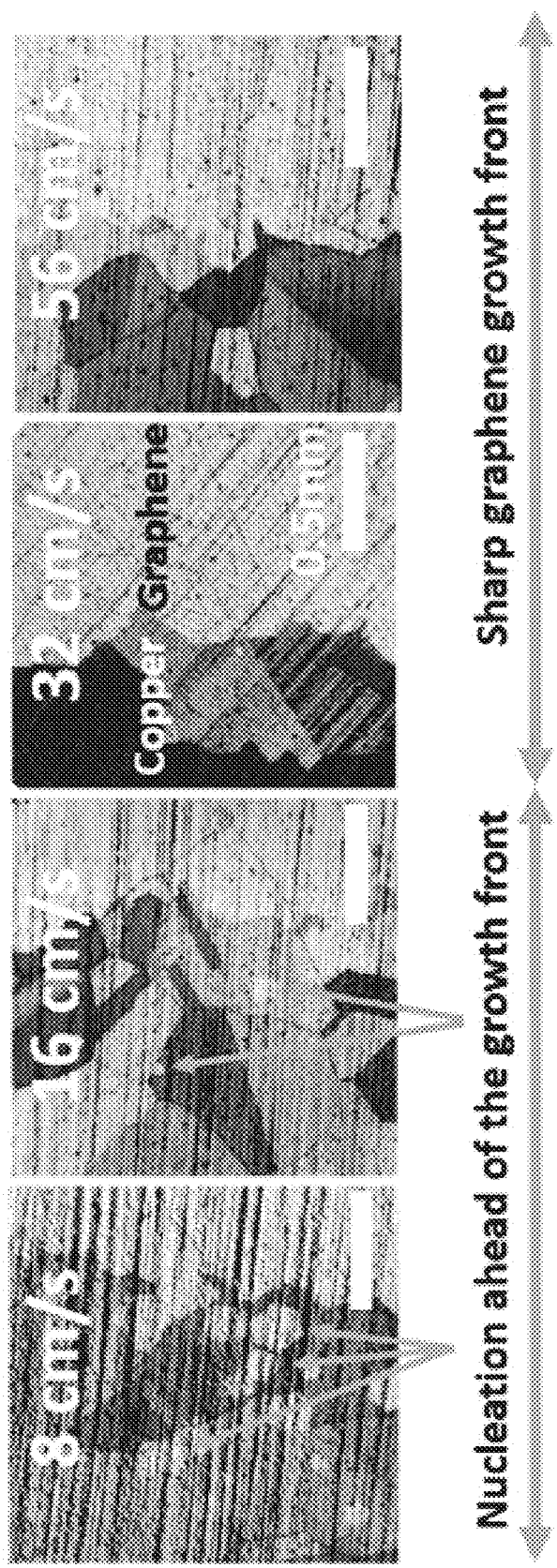
FIG. 5 includes images of graphene crystal growth on a substrate at different hydrogen gas flow rates.

With reference to FIGS. 4 and 5, the effect of the speed of the $H_2$/Ar gas through the deposition chamber is illustrated. The images in FIGS. 4 and 5 are of graphene deposits formed on a copper substrate at 1050° C. on a static substrate under the identified $H_2$/Ar gas speeds. Because of the directionality of the $H_2$/Ar gas, the $H_2$/Ar gas gas may also be referred to herein as the background "wind" within the chamber. As illustrated in FIG. 4, as the speed of the $H_2$/Ar gas increases from 8 cm/s to 120 cm/s, the area of the graphene deposit narrows and becomes more defined. The images in FIG. 5 show that at lower background wind speeds of 8 and 16 cm/s, there is graphene nucleation ahead of the growth front, as highlighted by the arrows. In contrast, at higher background wind speeds of 15 cm/s and greater, the graphene growth front sharpens and graphene nucleation ahead of the growth front is suppressed.

One method for determining the orientation of graphene domains on the substrate includes etching holes in the graphene in a hydrogen atmosphere for a predetermined period of time. The etching produces randomly placed hexagonal holes throughout the graphene that become visible after oxidation of the Cu or Ni—Cu alloy substrate. The hexagonal holes are terminated by the most stable zigzag edges, which are either parallel or at 60 degrees to each other when on the same single crystal domain; holes on different domains have no such correlation.

Figure 6:
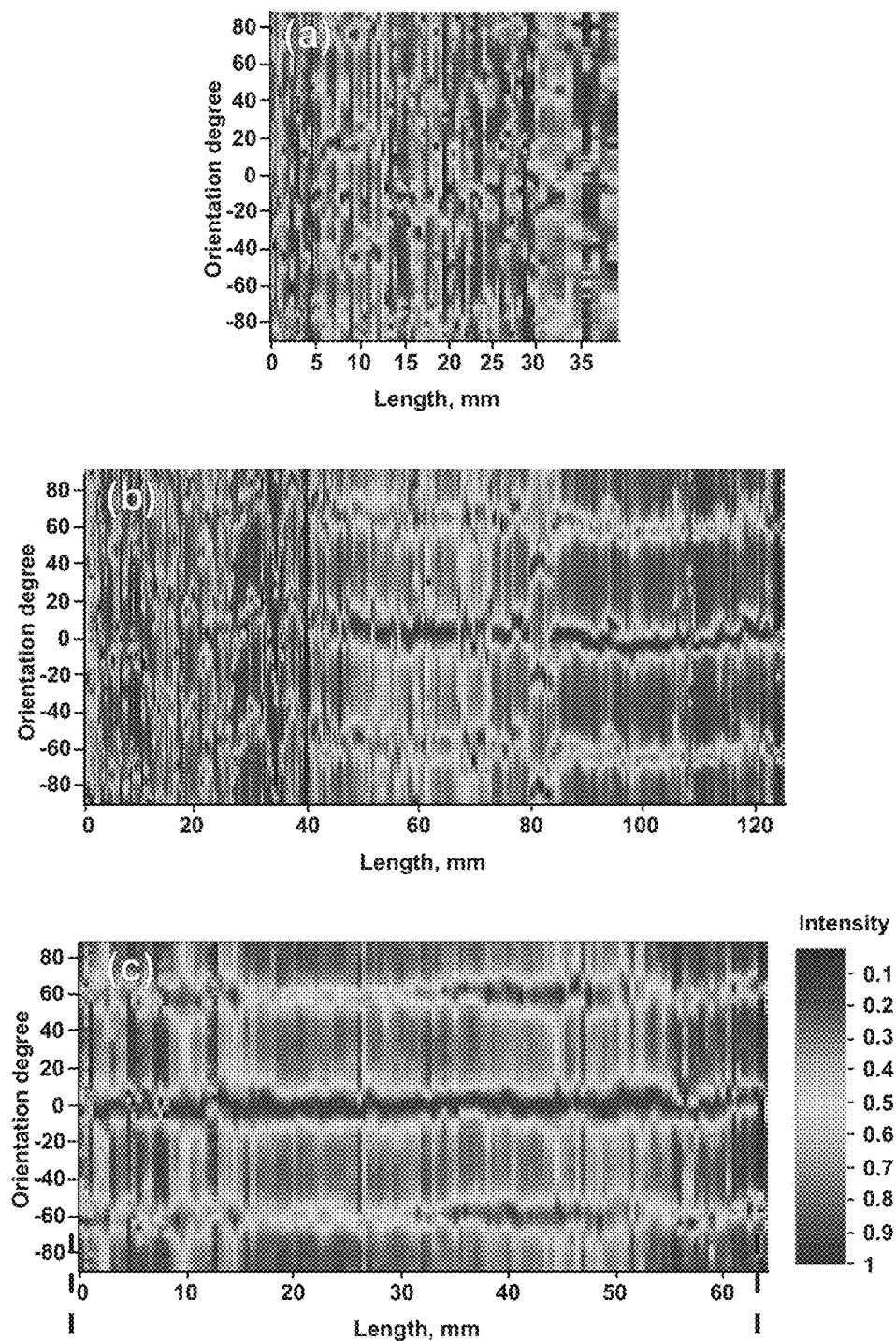
FIG. 6 includes histogram maps of polycrystalline and single crystal graphene.

FIG. 6 illustrates mapping histograms (a)-(c) for samples grown under conditions that include 8 cm/s $H_2$/Ar gas (a) and 32 cm/s $H_2$/Ar gas (b), (c) while the catalytic substrate is being drawn through the deposition chamber at 1.8 cm/hr. Each map represents the intensity of the histograms of the hole edge angular distribution (vertical axis) plotted as a function of position along a line in the direction the substrate is moving. As illustrated in FIG. 6(*a*), when the graphene is grown under 8 cm/s speed of the hydrogen gas, even when the sample is being drawn through the deposition chamber at 1.8 cm/hr, the speed of the hydrogen gas is not sufficient to inhibit nucleation of graphene ahead of the growth front and the result is polycrystalline graphene.

FIG. 6(*b*) illustrates a histogram map showing a single crystal graphene layer emerging from multiple domains. The histogram in (b) shows polycrystalline graphene for the first approximately 40 mm. However, after 40 mm, a single crystal graphene layer emerges for the remainder of the sample. Applicant proposes that this is the result of multiple graphene domains with different orientations initially growing and sharing access to the adatoms of activated carbon at the crystal growth front. The domain with the highest growth rate would be expected to eventually overwhelm the slower growing domains to become the sole surviving domain defining the orientation for the growth of a single crystal graphene layer. One method for promoting a higher growth rate of a particular domain is based on the orientation of the domain relative to the direction in which the substrate is moving during growth. If the sample is moved to quickly, the continuity of the single domain growth can be interrupted; if the sample is moved too slowly, other domains may overtake first, resulting in a polycrystalline sample.

The first approximately 40 mm of (b) in FIG. 6 illustrate how growth begins with multiple domains seen as randomly oriented hexagonal holes in the map. Eventually, as the substrate is moved through the deposition chamber under the appropriate conditions, one domain orientation prevails and the histogram converges into that for a single crystal after 40 mm. The distance over which a single domain overtakes the others and establishes a single crystal graphene layer can vary based on the initial orientations of the domains and the rate at which the substrate travels through the deposition chamber.

FIG. 6(*c*) illustrates the result of one approach to minimize the amount of polycrystalline graphene on the substrate. In the sample shown in (c), graphene deposition begins on the quartz substrate just prior to the edge of the copper substrate, which decreases the number of domains competing for dominance. In this manner, graphene growth as a single crystal layer can begin almost immediately at the beginning of the copper substrate.

Figure 7:
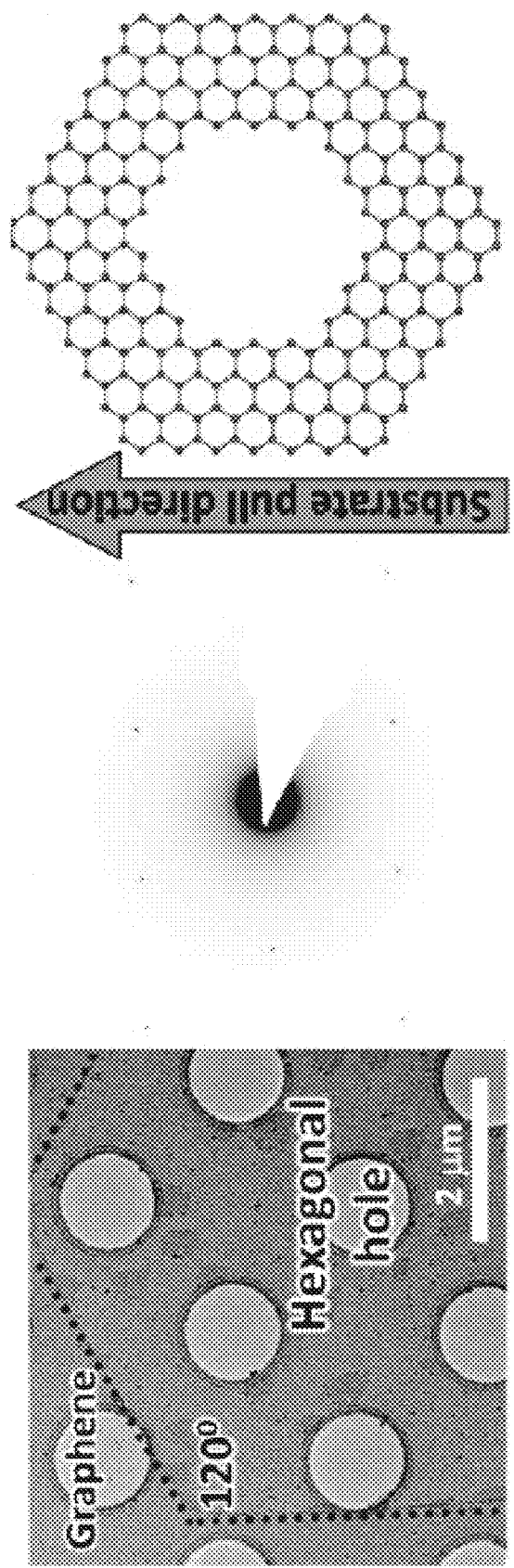
FIG. 7 includes a TEM image of an etched hole in a single crystal graphene and a representative illustration of the termination pattern of the graphene.

Referring now to FIG. 7, selective area diffraction (SAED) of a graphene region close to an etched hexagonal hole confirms that the etched holes have a zigzag termination. The SAED information, in combination with the histogram maps shown in FIG. 6 indicate that armchair termination is oriented perpendicular to the direction in which the substrate is traveling and thus armchair termination survives as the fittest or dominant termination compared to zigzag or other terminations.

Figure 8:
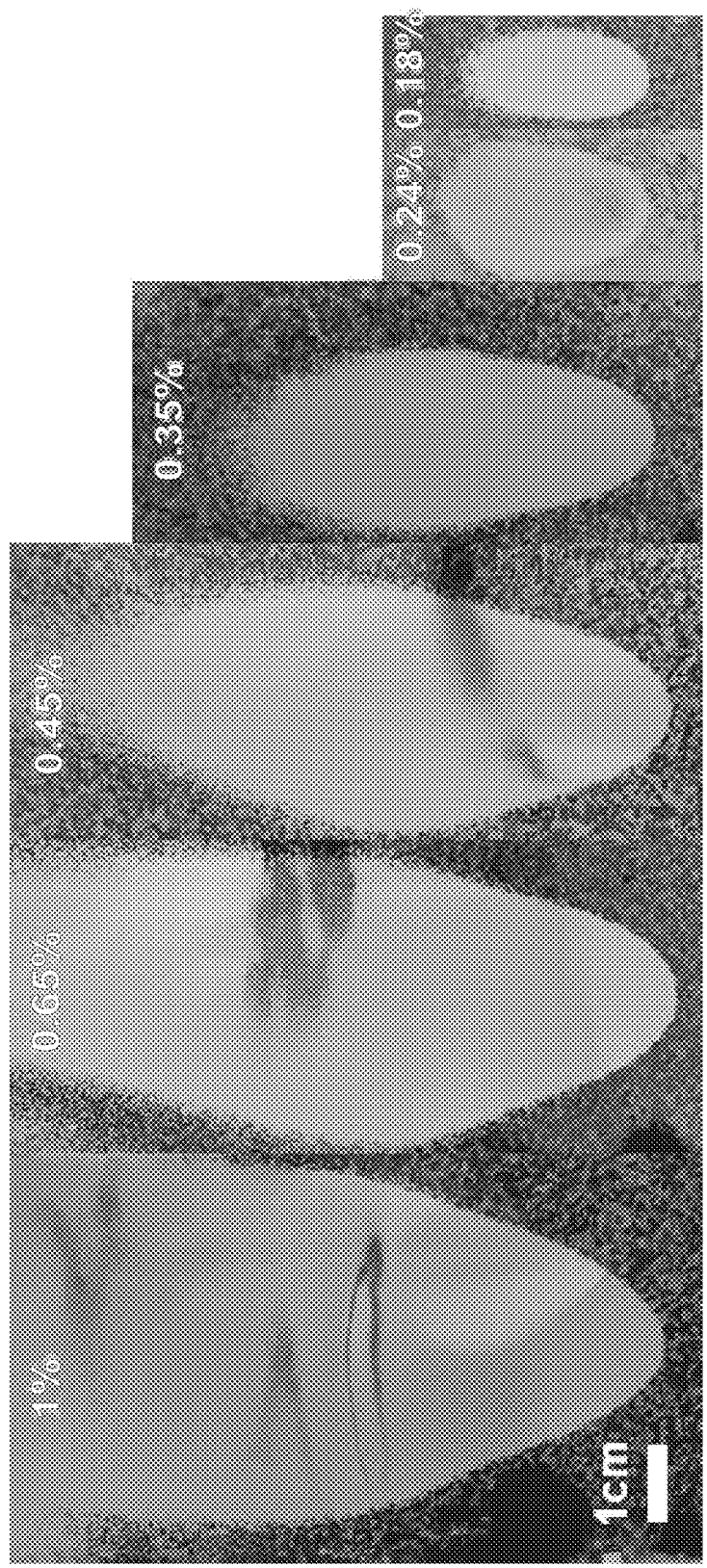
FIG. 8 includes images of a graphene footprint on a substrate for different concentrations of hydrocarbon gas.

FIG. 8 illustrates the effect of the concentration of the hydrocarbon precursor gas on the graphene layer formed on the copper substrate. The images shown in FIG. 8 are of graphene deposits formed on a copper substrate at 1050° C. on a static substrate under a $H_2$/Ar gas velocity of 32 cm/s. The flex from the precursor gas nozzle was kept at 10 sccm and deposition was performed for 10 min. As illustrated, increasing the methane concentration in the precursor gas from 0.1% to 1% $CH_4$/Ar increased the size of the graphene deposit.

IV. Example

Single crystal graphene was synthesized according to the methods and system described above in section III in accordance with the conditions provided in Table 1 of FIG. 9, which are intended to be non-limiting. The results in Table 1 demonstrate the effect of the combination of (a) the rate at which the catalytic substrate moves through the deposition chamber, (b) the flow rate of the hydrogen gas through the deposition chamber, (c) the flow rate of the hydrocarbon gas, (d) the content of the catalytic substrate, and (e) the deposition temperature.

For example, samples RR405 and RR406 exhibit a single crystal graphene layer with well aligned hexagons. However, as illustrated by samples RR402 and RR403 in which all of the conditions are the same as samples RR405 and RR406 except for the pulling rate, decreasing the pulling rate of catalytic substrate from 1.8 cm/hr to 0.4 cm/hr results in slippage of the single crystal graphene. Samples RR520 and RR521 illustrate how pulling the catalytic substrate too quickly past the hydrocarbon precursor gas opening results in multiple graphene domains as well as seed nucleation ahead of the crystal growth front.

Samples RR522 and RR523 illustrate the effect of flowing the hydrogen gas too quickly through the deposition. While these samples demonstrate little to no seed nucleation ahead of the crystal growth front, the rotating hexagons indicate multiple graphene domains, suggesting that no single domain was able to dominate.

Samples RR318, RR323, and RR332 illustrate the effect of changing the Ni content of the catalytic substrate. The higher Ni content samples were able to be pulled at a higher pulling rate without seed nucleation ahead of the crystal growth front compared to the lower Ni content samples. However, because the higher Ni content results in circular holes when etched, rather than hexagonal holes, the hole etching method for identifying monocrystalline domains could not be used to confirm whether samples RR318, RR323, and RR332 were single crystal graphene.

Typically, CVD grown monolayers require support for transferring the graphene onto another substrate. This is believed to be due to weak links between interdomain boundaries that are prone to breakage under lower stress than pristine single crystal graphene. A polymer frame, such as PMMA, is often used as a support during transfer. However, this support than needs to be removed by a solvent after transfer, which can be difficult to achieve completely and can also leave behind a residue. The methods described herein can be used to produce a single crystal graphene that can be transferred without the use of a polymer, thus avoiding the pitfalls discussed above.

Referring now to FIG. 10, image (a) illustrates a single crystal graphene of sample RR602 (conditions in Table 1) transferred onto a 4 inch quartz wafer. The single crystal monolayer was confirmed by UV/Vis transmittance at 550 nm (97.6%), shown in (b). The single crystal graphene sample can be transferred to a new substrate without the use of a polymer frame. Thus, the methods and systems described herein can be used to produce single crystal graphene that is capable of being utilized in a roll-to-roll configuration with continuous transition from graphene deposition to its delamination from the catalytic substrate onto a transfer substrate, without the use of a frame. A similar transferring procedure for graphene synthesized in a traditional batch CVD reactor typically results in a complete disintegration of the graphene film.

Figure 11:
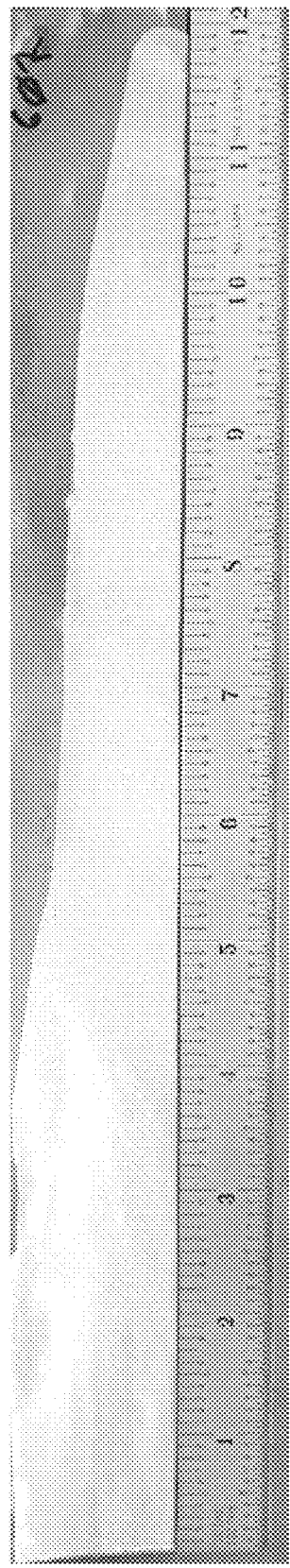
FIG. 11 includes a photograph of a 12 inch long single crystal graphene film grown according to the embodiments of the invention described herein.

FIG. 11 demonstrates the length to which a single crystal graphene film can be grown according to the methods and systems described herein. The sample in FIG. 11 is RR607, whose growth conditions are described in Table 1 of FIG. 9. A single crystal graphene film was grown up to a length of approximately 12 inches at a pulling rate of 1 cm/hr.

V. Conclusion

In summary, the methods and systems described herein can be used to provide continuous single crystal graphene films on polycrystalline substrates. The continuous single crystal graphene formation is promoted by generating a high concentration of hydrocarbon precursor at the crystal growth front to facilitate enlarging a single domain during growth while suppressing the growth of undesired seed domains ahead of the crystal growth front. This process allows for advancing local control of the concentration of the graphene precursors at the crystal growth front. The high speed hydrogen gas "wind" supplied during the growth process facilitates maintaining the high concentration gradient of the hydrocarbon precursor and may also facilitate inhibiting or removing seed domains ahead of the crystal growth front.

Films up to a foot long can be grown at rates up to 1.8 cm/hr or faster, depending on additional growth conditions. Growth conditions that affect the growth rate and dimensions of the single crystal graphene films include: the rate at which the catalytic substrate travels lengthwise through the deposition chamber during growth; the flow rate at which the hydrogen gas mixture flows lengthwise through the deposition chamber, in the same direction as that which the catalytic substrate is moving; locally supplying a hydrocarbon precursor at a predetermined location above the catalytic substrate; the deposition chamber temperature; the flux at the opening supplying the hydrocarbon precursor; and the content of the catalytic substrate.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to elements in the singular, for example, using the articles "a," "an," "the," or "said," is not to be construed as limiting the element to the singular.

The invention claimed is:
1. A method of synthesizing graphene comprising:
heating the interior of a chemical vapor deposition chamber to a temperature above 800° C.;

drawing a catalytic substrate through the interior of the chemical vapor deposition chamber in a first lengthwise direction;

introducing hydrogen gas into the interior of the chemical vapor deposition chamber in the same first lengthwise direction such that the hydrogen gas includes a flow rate of at least 15 cm/s in the first lengthwise direction, the hydrogen gas being mixed with an inert gas; and flowing a hydrocarbon gas through a reactive supply conduit and introducing the hydrocarbon gas into the interior of the chemical deposition chamber downwardly at an angle relative to the first lengthwise direction through an opening in the reactive supply conduit, the opening being immediately above a major surface of the catalytic substrate at a crystal growth front, wherein the hydrocarbon gas and the hydrogen gas form a precursor gas mixture, and wherein the catalytic substrate reacts with the precursor gas mixture to form continuous single crystal graphene on the catalytic substrate while being drawn in the same direction as the flow of the hydrogen gas.

2. The method of claim 1 wherein the opening is disposed between 1 mm to 10 mm above the catalytic substrate.

3. The method of claim 1 wherein the catalytic substrate comprises a polycrystalline substrate.

4. The method of claim 1 wherein at least one of a flux of the hydrocarbon gas through the opening and a flow rate of the hydrogen gas through the chemical vapor deposition chamber is selected to produce a concentration gradient of the hydrocarbon gas at the crystal growth front of the continuous single crystal graphene.

5. The method of claim 1, further comprising delaminating the continuous single crystal graphene from the catalytic substrate without a supporting polymer layer.

6. The method of claim 1 wherein the hydrogen gas comprises from 1.5 to 3% of hydrogen in a noble gas.

7. The method of claim 1 wherein the hydrocarbon gas comprises 0.35% or less of a hydrocarbon precursor in a noble gas.

8. The method of claim 1, further comprising maintaining a flux at the opening at 30 sccm or less.

9. The method of claim 1 wherein the drawing rate of the catalytic substrate is between 1 cm/hr to 2.5 cm/hr.

10. The method of claim 1, further comprising:
initiating growth of the continuous single crystal graphene on a support adjacent an edge of the catalytic substrate; and
continuing to draw the catalytic substrate through the chemical vapor deposition chamber and past the opening to form the continuous single crystal graphene on the catalytic substrate.

11. The method of claim 1 wherein the hydrocarbon gas is selected from the group consisting of methane, ethane, propane, butane, pentane, hexane, heptane, octane, benzene, toluene, and combinations thereof.

12. The method of claim 1 wherein the first lengthwise direction is perpendicular to an armchair termination edge of the continuous single crystal graphene.

* * * * *